US006282499B1

(12) United States Patent
Andersen

(10) Patent No.: US 6,282,499 B1
(45) Date of Patent: Aug. 28, 2001

(54) METHOD OF DETECTING MANUAL TRIPS IN AN INTELLIGENT ELECTRONIC DEVICE

(75) Inventor: Bo L. Andersen, Burlington, CT (US)

(73) Assignee: General Electric Company, Schenectady, NY (US)

(*) Notice: Subject to any disclaimer, the term of this patent is extended or adjusted under 35 U.S.C. 154(b) by 0 days.

(21) Appl. No.: 09/221,244

(22) Filed: Dec. 28, 1998

(51) Int. Cl.$^{7}$ .............................. G01R 19/00; H02H 3/00

(52) U.S. Cl. ................................ 702/64; 702/57; 702/61; 361/93.1; 361/93.2; 361/63

(58) Field of Search ................................ 702/57, 60, 61, 702/64; 324/415, 418, 424; 361/63, 88, 93.1, 93.2, 115; 340/635, 638, 644

(56) References Cited

U.S. PATENT DOCUMENTS

| | | | | |
|---|---|---|---|---|
| 4,814,712 | * | 3/1989 | Burton et al. | 324/424 |
| 4,884,021 | * | 11/1989 | Hammond et al. | 702/61 |
| 4,897,754 | | 1/1990 | Konishi et al. . | |
| 5,267,120 | | 11/1993 | Graff et al. . | |
| 5,493,278 | | 2/1996 | Mackenzie et al. . | |
| 5,506,573 | | 4/1996 | Ewing et al. . | |
| 5,539,605 | * | 7/1996 | Pollman et al. | 361/93.1 |
| 5,808,848 | * | 9/1998 | Pollman et al. | 361/93.2 |
| 6,065,148 | * | 5/2000 | Obermeier et al. | 714/763 |
| 6,078,489 | * | 6/2000 | Messerli et al. | 361/63 |
| 6,121,886 | * | 9/2000 | Andersen | 340/635 |

FOREIGN PATENT DOCUMENTS 0774 822 A1 10/1996 (EP) .

* cited by examiner

*Primary Examiner*—Marc S. Hopf
*Assistant Examiner*—Bryan Bui
(74) *Attorney, Agent, or Firm*—Cantor Colburn LLP; Carl B. Horton

(57) ABSTRACT

A method of detecting manual trips and reclose operations in an intelligent electronic device, e.g., electronic trip unit or protective relay, is presented. The intelligent electronic device includes a microcontroller and associated memories. An algorithm (program) stored in a memory of the intelligent electronic device detects manual trips when the following conditions are satisfied: (1) no trip event message has been issued by the trip unit within the reaction time required to trip the circuit breaker; (2) current becomes zero on all phases of the line; and (3) voltage downstream from the circuit breaker becomes zero on all phases. Reclose operations are detected when load side voltages on all phases return from 0V to nominal levels of the line side of the breaker.

19 Claims, 3 Drawing Sheets

METHOD OF DETECTING MANUAL TRIPS IN AN INTELLIGENT ELECTRONIC DEVICE

BACKGROUND OF THE INVENTION

The present invention relates generally to intelligent electronic devices, e.g., electronic trip units and protective relays. More specifically, the present invention relates to a method of detecting manual open (trip) or reclose operations in an intelligent electronic device.

Intelligent electronic devices are well known. By way of example, an electronic trip unit (one such intelligent electronic device) typically comprises voltage and current sensors which provide analog signals indicative of the power line signals. The analog signals are converted by an A/D (analog/digital) converter to digital signals which are processed by a microcontroller. The trip unit further includes RAM (random access memory), ROM (read only memory) and EEPROM (electronic erasable programmable read only memory) all of which interface with the microcontroller. The ROM includes trip unit application code, e.g., main functionality firmware, including initializing parameters, and boot code. The EEPROM includes operational parameters for the application code.

These electronic trip units have included a feature to count the number of trips by category, e.g., instantaneous, short time, long time, ground fault, or manual. However, not all manual trips are counted.

Manual trips are initiated via either remotely issued commands, or locally issued commands. Remotely issued commands are received as a network command by the trip unit and then executed. Locally issued commands are commands to open or close the breaker that are not processed by the trip unit, e.g., when an operator turns a breaker handle on or off manually, pushes a trip or reclose button or a trip or reclose signal is received via an auxiliary contact input to the breaker. Locally issued commands are not easily detected and therefore the resulting manual operations are not counted. Being able to count all breaker operations whether manual or automatic, locally or remotely generated is required to properly assess breaker contact wear.

BRIEF SUMMARY OF THE INVENTION

An electronic trip unit is described herein by way of example only, as the present invention applies to other intelligent electronic devices as well. The electronic trip unit comprising voltage and current sensors which provide analog signals indicative of the power line signals. The analog signals are converted by an A/D (analog/digital) converter to digital signals which are processed by a microcontroller. The trip unit further includes RAM (random access memory), ROM (read only memory) and EEPROM (electronic erasable programmable read only memory) all of which communicate with the microcontroller. The ROM includes trip unit application code, e.g., main functionality firmware, including initializing parameters, and boot code. The application code includes code for the manual trip detection algorithm of the present invention. The EEPROM includes operational parameters which may be stored in the trip unit at the factory, but can also be remotely downloaded.

In an exemplary embodiment of the invention, the manual operation detection algorithm detects manual operations initiated via remotely issued commands directly. Additionally, the algorithm detects manual operations initiated via locally issued commands when the following conditions are satisfied: (1) no trip or reclose event message has been issued by the trip unit within the reaction time required to operate the circuit breaker (trip/open); (2) current becomes zero on all phases of the line; and (3) voltage downstream (load side) from the circuit breaker becomes zero on all phases (reclose, voltage downstream (load side) from the circuit breaker goes from 0V on all phases to nominal voltage on all phases).

The present invention is useful in determining contact wear. Contact wear is directly proportional to the energy dissipated through the contacts as breakers are tripped. Additionally, some types of faults have more severe affects on contact wear than others, e.g., ground faults will wear down circuit breakers more quickly than manual trips. Therefore, it is advantageous to the analysis of contact wear that the present invention provides for a more accurate determination of the number of total trips per fault type by taking into account both the locally issued and remotely issued manual trips.

BRIEF DESCRIPTION OF THE DRAWINGS

Referring now to the drawings wherein.

DETAILED DESCRIPTION OF THE INVENTION

Figure 1:
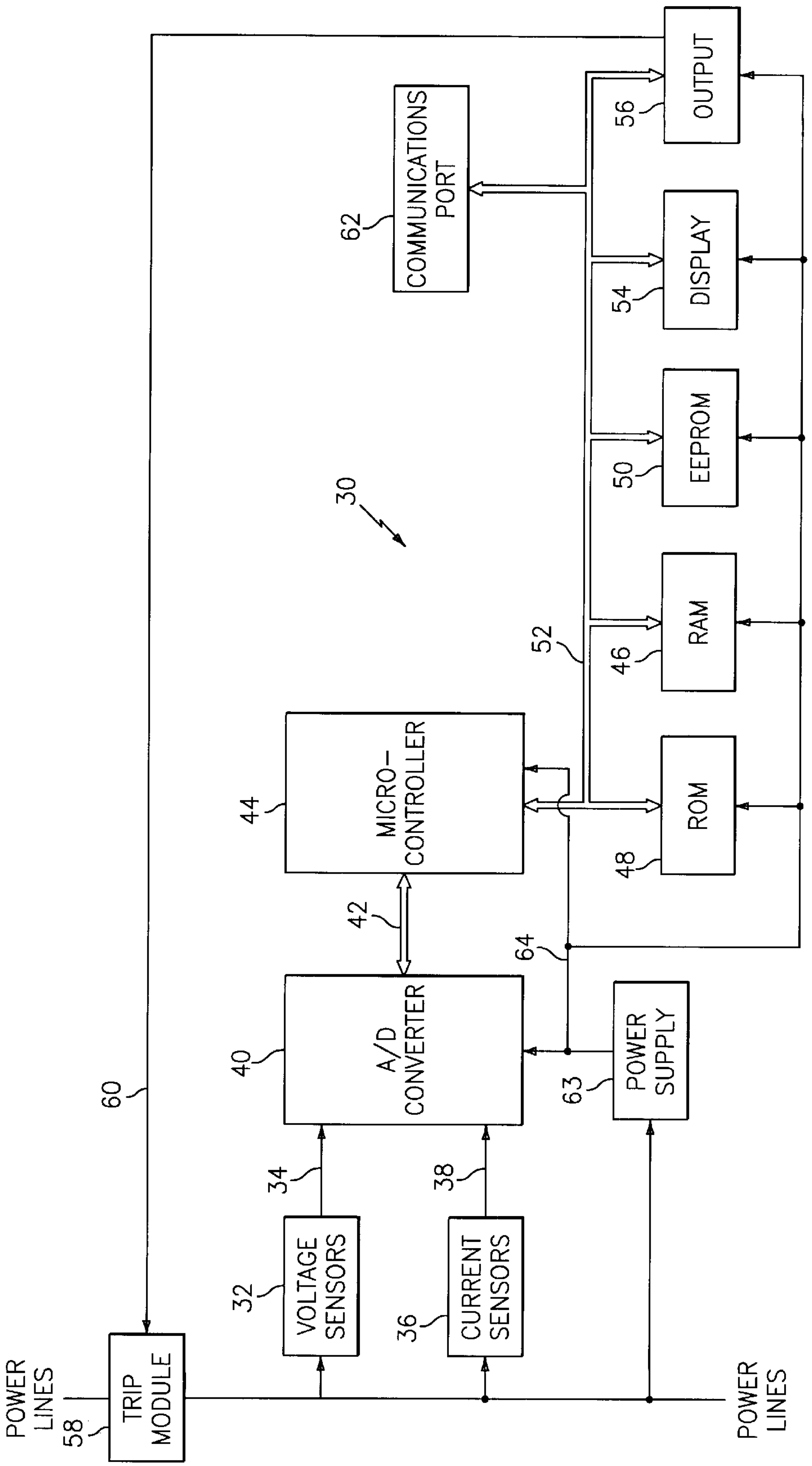
FIG. 1 is a schematic block diagram of an electronic trip unit of the present invention.

Referring to FIG. 1, a general schematic of a trip unit is generally shown at 30. It will be appreciated that the present invention is not limited to electronic trip units but is directed to intelligent electronic devices capable of controlling circuit breakers in general. Trip unit 30 comprises a voltage sensor 32 which provides analog signals indicative of voltage measurements on a signal line 34 and a current sensor 36 which provides analog signals indicative of a current measurements on a single line 38. The analog signals on lines 34 and 38 are presented to an A/D (analog/digital) converter 40, which converts these analog signals to digital signals. The digital signals are transferred over a bus 42 to a microcontroller (signal processor) 44, such being commercially available from the Hitachi Electronics Components Group (Hitachi's H8/300 family of microcontrollers). Trip unit 30 further includes RAM (random access memory) 46, ROM (read only memory) 48 and EEPROM (electronic erasable programmable read only memory) 50 all of which communicate with the microcontroller 44 over a control bus 52. It will be appreciated that A/D converter 40, ROM 48, RAM 46, or any combination thereof may be internal to microcontroller 44, as is well known. EEPROM 50 is non-volatile so that system information and programming will not be lost during a power interruption or outage. Data, typically status of the circuit breaker, is displayed by a display 54 in response to display signals received from microcontroller 44 over control bus 52. An output control device 56, in response to control signals received from microcontroller 44 over control bus 52. An output control device 56, in response to control signals received from microcontroller 44 over control bus 52, controls a trip module or device 58 (e.g., a circuit breaker or a relay) via a line 60. Calibration, testing, programming and other features are accomplished through a communications I/O port 62, which communicates with microcontroller 44 over control bus 52. A power supply 63 which is powered by the service electricity, provides appropriate power over a line 64 to the components of trip unit 30. ROM 48 includes trip unit application code, e.g., main functionality firmware, including initializing parameters, and boot code. The application code includes code for a manual trip detection algorithm in accordance with the present invention. EEPROM 50 includes operational parameter code which may be stored in the trip unit at the factory, but can also be remotely downloaded as described hereinafter. The manual trip detection algorithm is run in real-time and is initiated preferably from the boot code at start up.

In an exemplary embodiment of the invention, the algorithm detects manual operations of the trip module (breaker) 58 in response to locally issued commands at the electronic trip unit 30, e.g., such manual operations include an operator turning a breaker handle on or off manually, an operator pushing a trip or reclose button or a trip in response to a trip signal received from an auxiliary contact input of the breaker. It will be appreciated that other trip events, i.e., short time, long time, instantaneous, ground fault, or manual trip events in response to remotely issued trip commands, are counted or tracked as is known in the prior art. Moreover, it will further be appreciated that it is the combination or total of operations counts and/or (in the case of trip operations) trip types that is useful in determining contact wear of the breaker. In the present invention, voltage sensors 32 are located downstream of breaker 58 (FIG. 1) (for reasons explained hereinafter).

The algorithm detects the aforementioned manual operations (in response to locally issued commands) when the following conditions are satisfied:

(1) no trip event message has been issued by the trip unit 30 within the reaction time required to trip the circuit breaker 58, as determined by microcontroller 44 (trip or open commands);

(2) current, as sensed by current sensors 36, becomes zero on all phases; and (3) voltage downstream from the circuit breaker 58, as sensed by the downstream (load side) voltage sensors, becomes zero on all phases (a manual close operation is detected when no reclose command was received by the trip unit yet voltage is detected on all phases on the load side of the breaker).

The direction of current would be required when the breaker 58 is being back-fed, i.e., reverse current flow. In order to detect the latter of the three conditions, voltage sensors 38 are located downstream of breaker 58 (FIG. 1) as described hereinbefore. When the three conditions are detected a signal is then generated indicating the occurrence of a manual trip which is counted. This count is used to aid in the assessment of contact wear of the breaker or relay, as described hereinbefore.

Figure 2:
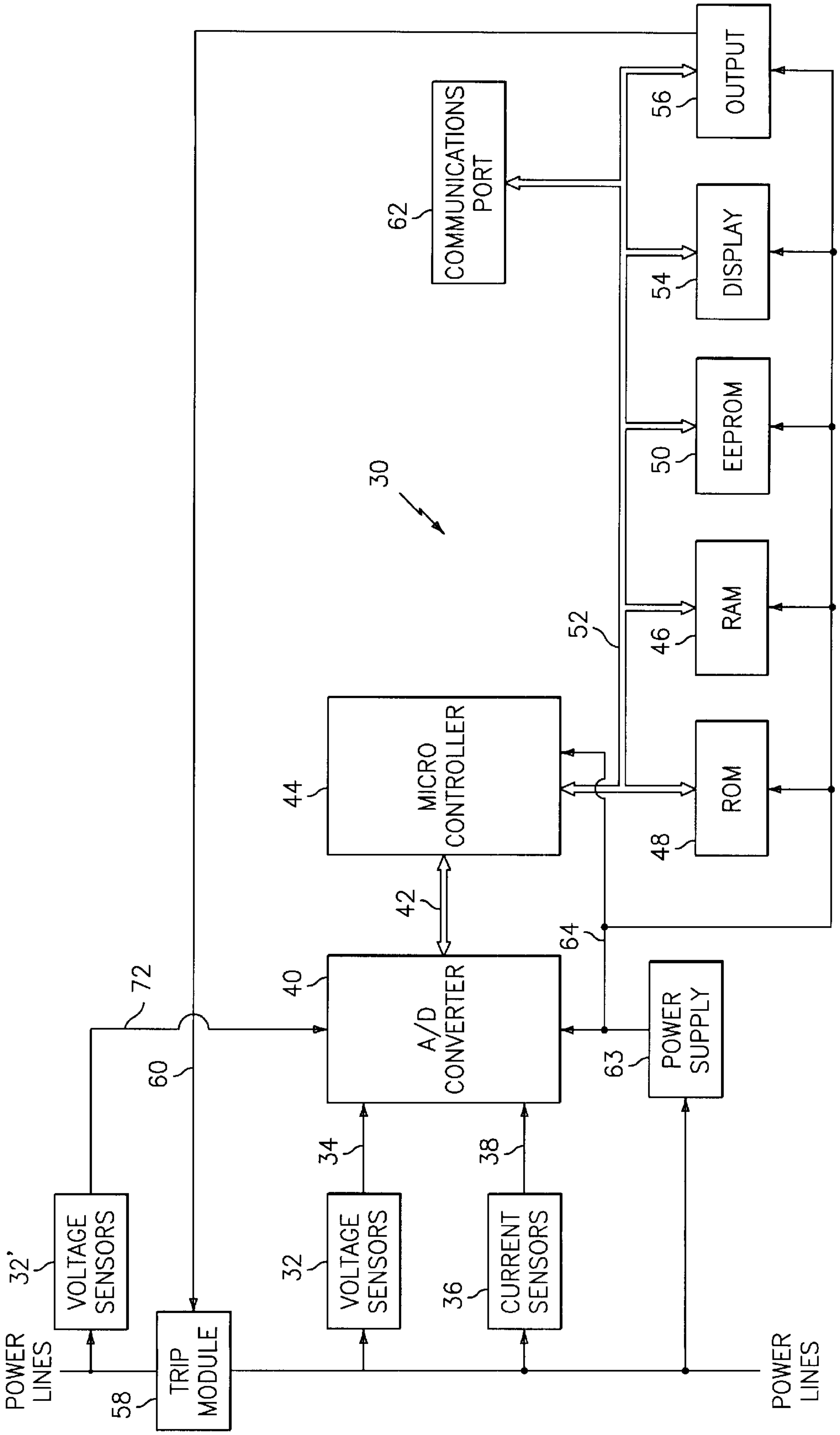
FIG. 2 is a schematic block diagram of an electronic trip unit of the present invention in accordance with an alternate embodiment.

With the voltage sensors 32 located downstream of breaker 58, the voltage data upstream of breaker 58 is not available when breaker 58 is open. Accordingly, in an alternate embodiment of the present invention additional voltage sensors 32' are located upstream of breaker 58 (FIG. 2) with voltage sensors 32 being located downstream of breaker 58. The upstream voltage sensors 32' also provide analog signals indicative of voltage measurements on a signal line 72 to A/D converter 40. In this example, voltages upstream and downstream of breaker 58 are sensed, even when breaker 58 is open. The use of upstream and downstream voltage sensors 32', 32 also provides for determining when breaker 58 is being back-fed, i.e., reverse currents.

Figure 3:
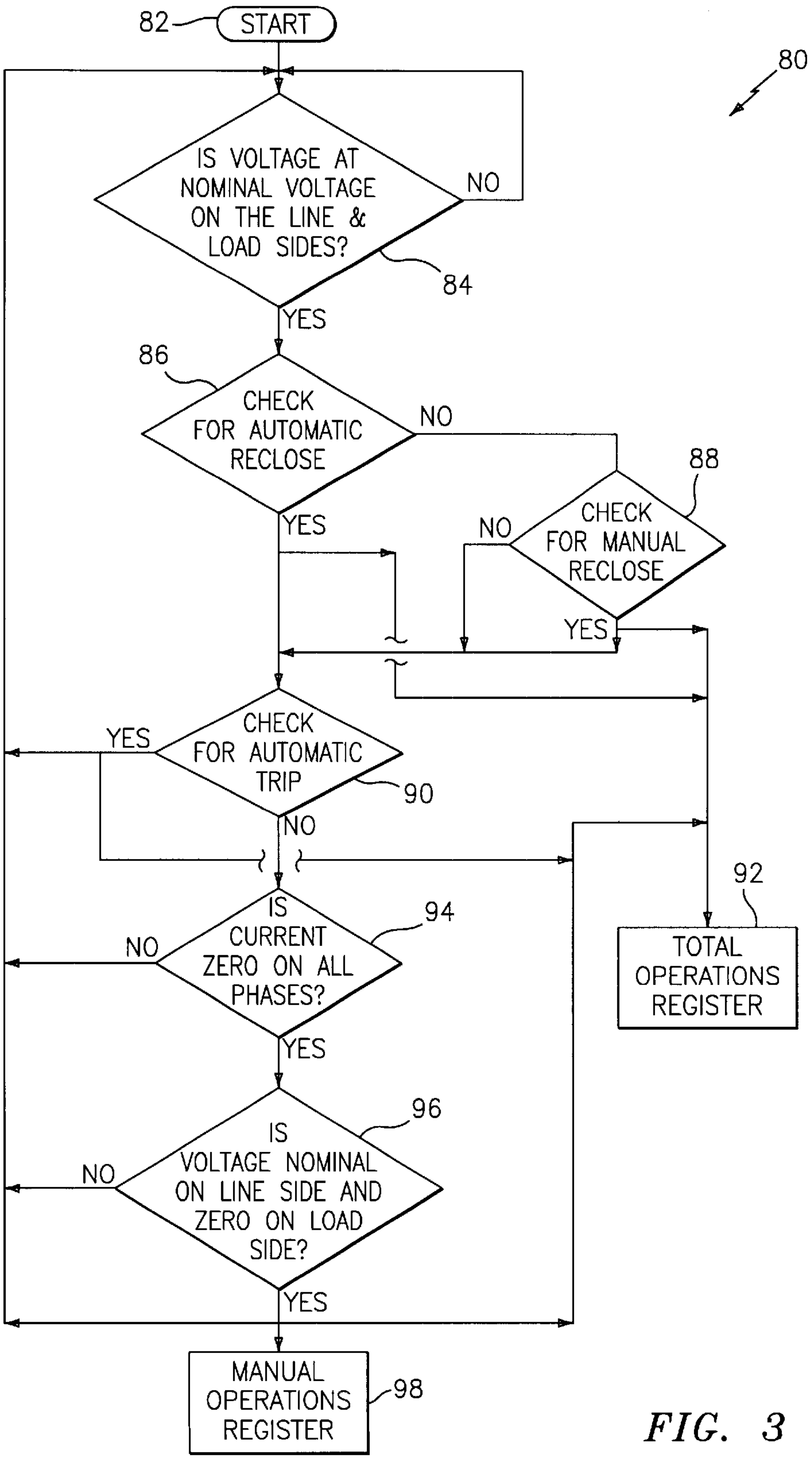
FIG. 3 is a flow diagram of the manual trip detection algorithm of the present invention.

Referring to FIG. 3, an exemplary embodiment of a flow diagram of the manual trip detection algorithm of the present invention is shown generally at 80. The manual trip detection algorithm is applied to each of the phases of the power lines. The detection algorithm (program) is initiated preferably from the boot code at startup, block 82, and proceeds immediately to block 84. At block 84 the program determines if voltage is nominal at the line and load sides. If voltage is not nominal, then the program loops back to block 82 where it starts again, otherwise the program flows to block 86. In block 86 the program determines if an automatic reclose has occurred. If an automatic reclose has not occurred, then the program determines at block 88 if a manual reclose has occurred. If an automatic reclose (block 86) or a manual reclose (block 88) has occurred, then proceed to block 90, and also increment a total operations register at block 92. At block 90 the program determines if an automatic trip (including remote manual) has occurred. If an automatic trip has occurred, then the program loops back to block 82 where it starts again, and the total operations register is also incremented at block 92. If an automatic trip has not occurred, then proceed to block 94. At block 94 the program determines if current is zero on all phases of the power lines. If current is not zero on all phases the program loops back to block 82 where it starts again, otherwise the program flows to block 96. At block 96 the sensed voltage downstream (load side) from the circuit breaker is checked for a zero reading on all phases. If downstream voltages are not zero, then the program returns to block 82. Also, in block 96 the sensed voltage upstream (line side) from the circuit breaker is checked for a nominal voltage reading on all phases. If the upstream voltages are not nominal, then the program returns to block 82. If these two conditions are not met, then the program flows to block 88. Thereby accounting for back-feeding, i.e., current flowing in the reverse direction, which occurs when downstream voltage is greater than upstream voltage. All conditions for detecting a locally issued manual trip event having been satisfied, the program will increment both the total trip operations count register, block 92, and a locally issued manual trip count register, block 98. The program also returns to block 82 and the above process is continued until the unit is shut down.

A total operations counter (reclose operations, manual trips, all trips or by trip types) and/or the occurrence of a manual operation may be displayed at the trip unit 30 or at a central computer (not shown). This information is useful in assessing contact wear of the circuit breaker, such as exemplified in U.S. patent application Ser. No. 09/221,884 entitled A Method of Determining Contact Wear In A Trip Unit, filed concurrently herewith, which is incorporated herein by reference. As described in the above referenced Application, for each operation of an energized breaker a measure of the energy dissipated as breakers are opened or closed is calculated as $(I^2)(T)$, where I is the contact current and T is the contact temperature. This energy dissipation is calculated and then summed up in registers of the microcontroller (e.g., at blocks 86, 88 for reclose operations, at block 90 for automatic open/trip operations, and at block 98 for manual open/trip operations) for each contact and for each fault or operations type, e.g., short-time, long-time, ground fault, instantaneous, and manual, to provide cumulative energy by fault or operations type or in total.

In addition to detecting contact wear, the present invention can be used to develop a history of contact wear. As cumulative energy dissipated in the breaker contacts increases over time contact wear will also increase. This information can be used to predict how much of a contact's life is used up (or remains).

A priority ranking of maintenance tasks for maintaining circuit breakers may be established based on this information, i.e., which circuit breaker will require maintenance first due to the number of trips. Many large facilities have hundreds of circuit breakers to maintain. Users typically overhaul a certain percentage of their circuit breakers annually. Therefore accurately prioritizing the order in which individual circuit breaker problems should be addressed will allow for more effective use of limited resources, and help decrease facility down time.

While preferred embodiments have been shown and describe, various modifications and substitutions may be made thereto without departing from the spirit and scope of the invention. Accordingly, it is to be understood that the present invention has been described by way of illustration and not limitation.

What is claimed is:

1. A method of detecting manual operations of a trip device at an intelligent electronic device in an electrical distribution system, comprising:

sensing a current at a line of the electrical distribution system to provide a sensed current signal indicative thereof;

sensing a voltage at the line of the electrical distribution system to provide a sensed voltage signal indicative thereof; and generating a manual operation signal indicating an occurrence of a manual operation of the trip device when in the absence of a trip command having been issued or processed by the intelligent electronic device said sensed current signal becomes zero on all phases of the line and said sensed voltage signal becomes zero on all phases of the line.

2. The method of claim 1 wherein said sensing said voltage at the line comprises sensing said voltage at the line downstream of the trip device.

3. The method of claim 2 further comprising:

sensing a voltage at the line upstream of the trip device to provide a sensed upstream voltage signal indicative thereof.

4. The method of claim 1 further comprising:

counting each said manual operation signal to provide a count of a total number of said manual operations of the trip device.

5. The method of claim 4 further comprising:

assessing contact wear in the trip device in response to said count.

6. The method of claim 4 further comprising;

displaying information indicative of said count.

7. The method of claim 1 wherein the trip device comprises a circuit beaker or a protective relay.

8. The method of claim 1 wherein the intelligent electronic device comprises an electronic trip unit.

9. The method of claim 1 further comprising;

displaying information indicative of said manual operation in response to said manual operation signal.

10. The method of claim 1 wherein said manual operation comprises a manual open, manual close or manual reclose operation.

11. An intelligent electronic device comprising:

a trip device at an electrical distribution system;

a current sensor for sensing a current at a line of the electrical distribution system to provide a sensed current signal indicative thereof;

a voltage sensor for sensing a voltage at the line of the electrical distribution system to provide a sensed voltage signal indicative thereof; and a signal processor responsive to said sensed current signal and said sensed voltage signal to generate a manual operation signal indicating an occurrence of a manual operation of said trip device when in the absence of a trip command having been issued or processed by said signal processor said sensed current signal becomes zero on all phases of the line and said sensed voltage signal becomes zero on all phases of the line.

12. The intelligent electronic device of claim 11 wherein said voltage sensor is located downstream of said trip device.

13. The intelligent electronic device of claim 12 further comprising:

an upstream voltage sensor located upstream of said trip device for sensing a voltage at the line upstream of said trip device to provide a sensed upstream voltage signal indicative thereof.

14. The intelligent electronic device of claim 11 further comprising:

at least one counter for counting each said manual operation signal to provide a count of a total number of said manual operations of said trip device.

15. The intelligent electronic device of claim 14 further comprising;

a display interfacing with said counter for displaying information indicative of said count.

16. The intelligent electronic device of claim 11 wherein said trip device comprises a circuit beaker or a relay.

17. The intelligent electronic device of claim 11 wherein said intelligent electronic device comprises an electronic trip unit.

18. The intelligent electronic device of claim 11 further comprising;

a display response to said manual operation signal for displaying information indicative of said manual operation of said trip device.

19. The intelligent electronic device of claim 11 wherein said manual operation comprises a manual open, manual close or manual reclose operation.

* * * * *